US011875872B2

(12) United States Patent
Chien et al.

(10) Patent No.: US 11,875,872 B2
(45) Date of Patent: Jan. 16, 2024

(54) COMPUTER DEVICE, SETTING METHOD FOR MEMORY MODULE AND MAINBOARD

(71) Applicant: GIGA-BYTE TECHNOLOGY CO.,LTD., New Taipei (TW)

(72) Inventors: Chia-Chih Chien, New Taipei (TW); Sheng-Liang Kao, New Taipei (TW); Chen-Shun Chen, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 51 days.

(21) Appl. No.: 17/701,649

(22) Filed: Mar. 22, 2022

(65) Prior Publication Data

US 2023/0215475 A1     Jul. 6, 2023

(30) Foreign Application Priority Data

Dec. 30, 2021 (TW) ................................ 110149523

(51) Int. Cl.
*G06F 9/4401* (2018.01)
*G11C 7/10* (2006.01)

(52) U.S. Cl.
CPC .......... *G11C 7/1027* (2013.01); *G06F 9/4403* (2013.01); *G11C 7/1021* (2013.01); *G06F 9/4401* (2013.01)

(58) Field of Classification Search
CPC ....................................................... G06F 9/04
See application file for complete search history.

(56) References Cited

U.S. PATENT DOCUMENTS

| 8,006,062 | B1* | 8/2011 | Cheng | ................... | G06F 9/4401 |
| | | | | | 711/170 |
| 10,235,259 | B2 | 3/2019 | Chen et al. | | |
| 2003/0005278 | A1* | 1/2003 | Deng | ................... | G06F 3/0661 |
| | | | | | 713/2 |
| 2010/0146322 | A1* | 6/2010 | Chien | ...................... | G06F 1/08 |
| | | | | | 713/600 |

FOREIGN PATENT DOCUMENTS

| CN | 103714037 | 4/2014 |
| TW | I526847 | 3/2016 |
| TW | I635382 | 9/2018 |

OTHER PUBLICATIONS

"Office Action of Taiwan Counterpart Application", dated Aug. 3, 2022, p. 1-p. 8.

* cited by examiner

*Primary Examiner* — Paul Yen
(74) *Attorney, Agent, or Firm* — JCIPRNET

(57) ABSTRACT

A computer device, a setting method for a memory module, and a mainboard are provided. The computer device includes a memory module, a processor, and the mainboard. A basic input output system (BIOS) of the mainboard stores an extreme memory profile (XMP). When the processor performs the BIOS so that the computer device displays a user interface (UI), the BIOS displays an overclocking option corresponding to the XMP in a selection list of the UI. When the BIOS receives a selection request corresponding to the overclocking option of the selection list, the BIOS reads multiple memory setting parameters corresponding to the XMP, and configures the memory module according to the memory setting parameters.

17 Claims, 5 Drawing Sheets

COMPUTER DEVICE, SETTING METHOD FOR MEMORY MODULE AND MAINBOARD

CROSS-REFERENCE TO RELATED APPLICATION

This application claims the priority benefit of Taiwan application serial no. 110149523, filed on Dec. 30, 2021. The entirety of the above-mentioned patent application is hereby incorporated by reference herein and made a part of this specification.

BACKGROUND

Technical Field

The disclosure relates to a computer device, a setting method, and a mainboard disposed in the computer device, and more particularly to a computer device capable of performing overclocking, a setting method for a memory module, and a mainboard.

Description of Related Art

Generally speaking, a user may perform overclocking on the memory module in a computer device to improve the working performance of the computer device. However, the memory setting parameters for overclocking are quite numerous and complicated, so performing overclocking correctly and conveniently is difficult for the user. Moreover, some memory module manufacturers do not pre-store the memory setting parameters configured for overclocking in the memory module, so the user cannot perform overclocking smoothly.

SUMMARY

The disclosure provides a computer device capable of configuring a memory module in a quick and convenient way to overclock the memory module.

The computer device of the disclosure includes a memory module, a processor, and a basic input output system (BIOS). The memory module has a serial presence detect (SPD) module. The processor is coupled to the memory module. The BIOS is coupled to the processor. The BIOS stores a first extreme memory profile (XMP). When the processor performs the BIOS so that the computer device displays a user interface (UI), the BIOS displays a first overclocking option corresponding to the first XMP in a selection list of the UI. When the BIOS receives a selection request corresponding to the first overclocking option of the selection list, the BIOS reads multiple first memory setting parameters corresponding to the first XMP, and configures the memory module according to the first memory setting parameters.

The embodiment of the disclosure further provides a setting method for the memory module. The setting method includes the following steps: performing, by the processor, the BIOS storing the first XMP to display the UI through the computer device; displaying, by the BIOS, the first overclocking option corresponding to the first XMP in the selection list of the UI; reading, by the BIOS, multiple first memory setting parameters corresponding to the first XMP when the BIOS receives a selection request corresponding to the first overclocking option in the selection list; and configuring, by the BIOS, the memory module according to the first memory setting parameters.

The embodiment of the disclosure further provides a mainboard. The mainboard is disposed in the computer device and includes a BIOS. The BIOS stores a first XMP, and is coupled to the memory module and the processor disposed on the mainboard. When the processor performs the BIOS so that the computer device displays a UI, the BIOS displays a first overclocking option corresponding to the first XMP in a selection list of the UI. When the BIOS receives a selection request corresponding to the first overclocking option of the selection list, the BIOS reads multiple first memory setting parameters corresponding to the first XMP, and configures the memory module according to the first memory setting parameters.

Based on the above, the computer device, the setting method for memory module, and the mainboard of the embodiments of the disclosure can select overclocking options corresponding to the XMP through the UI so that the BIOS performs overclocking on the memory module according to the XMP corresponding to the selected overclocking option. Therefore, the user can achieve overclocking of the memory module through the UI in a fast and convenient way.

DESCRIPTION OF THE EMBODIMENTS

Figure 1:
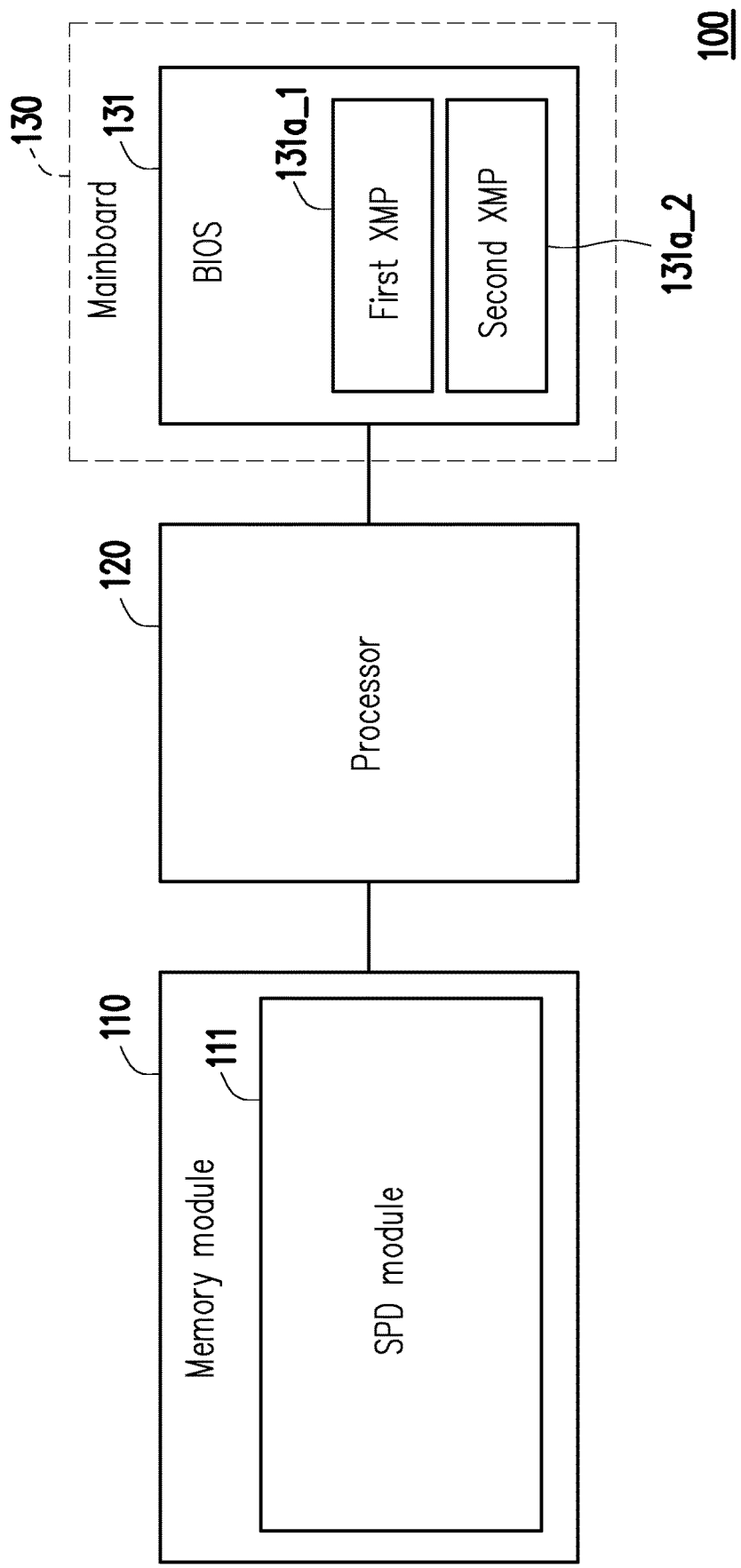
FIG. 1 is a schematic diagram of a computer device according to an embodiment of the disclosure.

Some embodiments of the disclosure accompanied with drawings are described in detail as follows. The reference numerals used in the following description are regarded as the same or similar elements when the same reference numerals appear in different drawings. These embodiments are only a part of the disclosure, and do not disclose all the possible implementation modes of the disclosure. To be more precise, the embodiments are only examples in the scope of the claims of the disclosure.

FIG. 1 is a schematic diagram of a computer device according to an embodiment of the disclosure. Please refer to FIG. 1. The computer device 100 includes a memory module 110, a processor 120, and a mainboard 130. In the embodiment, the computer device 100 is applied to a computer operating system. The mainboard 130 has a memory socket and a central processing unit (CPU) socket for the disposition of the memory module 110 and the processor 120, respectively.

In the embodiment, the memory module 110 is coupled to the processor 120, and has a serial presence detect (SPD) module 111. In the embodiment, the SPD module 111 may store a memory profile. The memory profile has multiple memory setting parameters. The processor 120 can operate the memory module 110 according to the memory setting parameters of the memory profile so that the computer device 100 operates with a specific performance.

In the embodiment, the mainboard 130 further includes a basic input output system (BIOS) 131. The BIOS 131 is coupled to the processor 120. In the embodiment, the BIOS 131 stores at least one extreme memory profile (XMP), such as the first XMP 131a_1 and the second XMP 131a_2. The number of the first XMP 131a_1 and the second XMP 131a_2 is only an example, and is not limited thereto. It should be noted that each of the XMPs (including the first XMP 131a_1 and the second XMP 131a_2) stored in the BIOS 131 has been overclocked and tested for stability and compatibility in order to perform overclocking on the memory module 110.

In the embodiment, the first XMP 131a_1 and the second XMP 131a_2 are configured by the manufacturer of the mainboard 130 or other computer accessories. The first XMP 131a_1 has multiple first memory setting parameters corresponding to higher than basic performance. The second XMP 131a_2 has multiple second memory setting parameters corresponding to higher than basic performance. The processor 120 can operate the memory module 110 according to the first memory setting parameters of the first XMP 131a_1 or the second memory setting parameters of the second XMP 131a_2 so that the computer device 100 operate with higher performance. It should be noted that the first memory setting parameters of the first XMP 131a_1 and the second memory setting parameters of the second XMP 131a_2 may be configured to perform overclocking on the memory modules 110 of the corresponding memory particles (chips), respectively.

In the embodiment, the mainboard 130 further includes a storage device. The storage device may be a flash memory. The storage device may store the BIOS 131. In the embodiment, the BIOS 131 is a form of firmware embedded in the computer device 100.

In the embodiment, the computer device 100 may be a personal computer, a notebook computer, a tablet computer, etc., a device having a computing function. In the embodiment, the processor 120 may be a central processing unit (CPU).

In the embodiment, the memory module 110 may be a dynamic random access memory (DRAM), for example, a synchronous dynamic random access memory (SDRAM). In the embodiment, the memory module 110 is a double data rate 5 synchronous dynamic random access memory (DDR5 SDRAM). In some embodiments, the memory module 110 is another type of DRAM. Therefore, the SPD module 111 stores the memory profile corresponding to the basic performance, but does not store the memory setting parameters configured for overclocking or any XMP.

Figure 2:
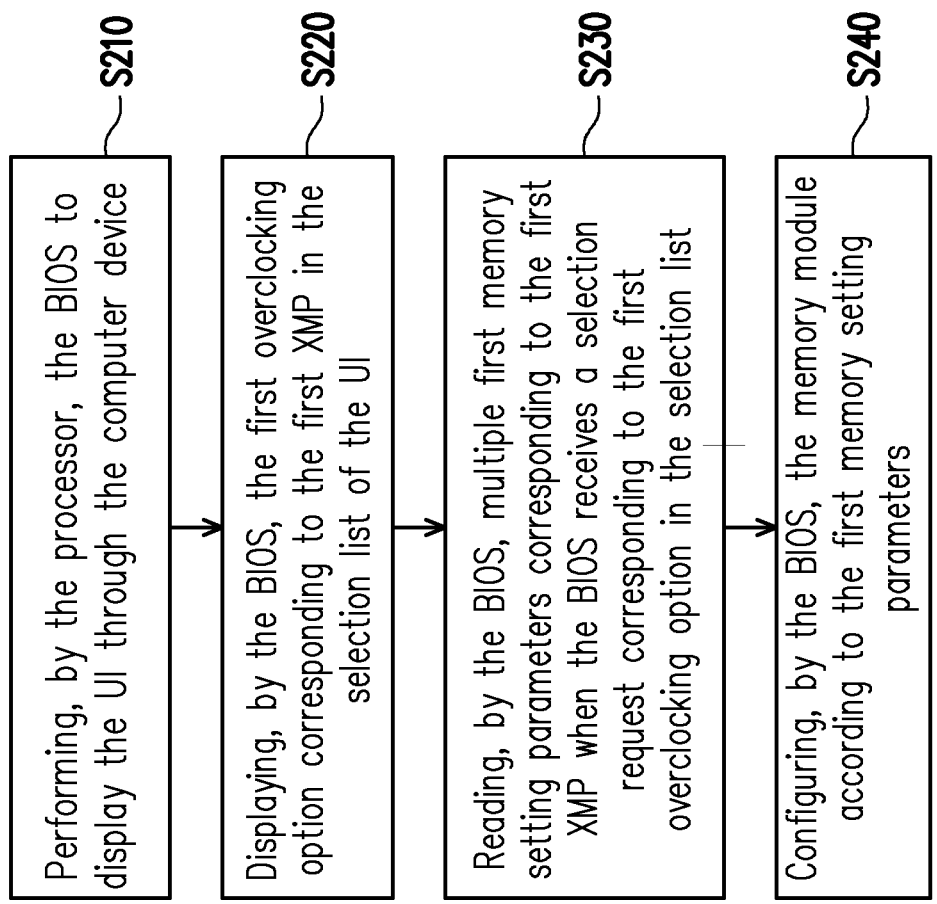
FIG. 2 is a flowchart of a setting method for a memory module according to an embodiment of the disclosure.

FIG. 2 is a flowchart of a setting method for a memory module according to an embodiment of the disclosure. Please refer to FIGS. 1 and 2. The computer device 100 may perform the following steps S210 to S240 to configure the memory module 110. After the computer device 100 is booted, a user may enter the BIOS 131 through a shortcut key of the computer device 100. In step S210, the BIOS 131 is performed by the processor 120 to display a user interface (UI) by the computer device 100. In the embodiment, the display of the computer device 100 may display the UI. The user may operate the BIOS 131 through the UI to configure the memory setting parameters for operating the memory module 110.

In step S220, the first overclocking option corresponding to the first XMP 131a_1 is displayed in the selection list of the UI through the BIOS 131. In the embodiment, when the computer device 100 displays the UI, in addition to displaying the first overclocking option corresponding to the first XMP 131a_1 in the selection list of the UI, the BIOS 131 further displays the second overclocking option corresponding to the second XMP 131a_2 in the selection list of the UI. In other words, the BIOS 131 displays multiple overclocking options (including the first overclocking option and the second overclocking option) in the selection list through the UI.

In the embodiment, the user may select an overclocking option (for example, the first overclocking option) in the selection list through the UI so that the BIOS 131 generates a corresponding selection request. The selection request is a signal or command generated by the user operating the UI through the input device of the computer device 100. In step S230, when the BIOS 131 receives the selection request corresponding to the first overclocking option, the BIOS 131 reads the multiple first memory setting parameters corresponding to the first XMP 131a_1. In some embodiments, the user may select another overclocking option (for example, the second overclocking option) in the selection list so that the BIOS 131 generates another corresponding selection request. When the BIOS 131 receives another selection request corresponding to the second overclocking option, the BIOS 131 reads the multiple second memory setting parameters corresponding to the second XMP 131a_2.

In step S240, the BIOS 131 configures the memory module 110 according to the first memory setting parameters so that the BIOS 131 perform overclocking on the memory module 110 according to the first memory setting parameters. Specifically, in the embodiment, the BIOS 131 writes the read first memory setting parameters to the memory profile in the SPD module 111. In other words, the computer device 100 configures the memory module 110 through the built-in XMP in the BIOS 131 to perform the overclocking operation of the memory module 110. In addition, the computer device 100 may also simultaneously overwrite the memory setting parameters corresponding to the XMP in the BIOS 131 to the memory profile in the SPD module 111 for storage. In some embodiments, the BIOS 131 overwrites the first XMP 131a_1 as a memory profile in the SPD 111. In some embodiments, when the BIOS 131 reads the second memory setting parameters in step S230, the BIOS 131 configures the memory module 110 according to the second memory setting parameters, so as to perform overclocking on the memory module 110 according to the second memory setting parameters. Specifically, in some embodiments, the BIOS 131 writes the read second memory setting parameters to the memory profile in SPD module 111 or the BIOS 131 overwrites the second XMP 131a_2 as a memory profile in the SPD module 111.

It is worth mentioning here that the user can select the desired overclocking option through the UI so that the BIOS 131 configures the memory module 110 according to the XMP (the first XMP 131a_1 or the second XMP 131a_2) corresponding to the selected overclocking option to achieve overclocking of the memory module 110. It should be noted that XMPs with different memory setting parameters generate different overclocking effects. In this way, the user does not need to repeatedly adjust the content of the XMP or adjust the parameter details of the memory profile one by one, but may directly select the optimized XMP and complete the memory overclocking operation after restarting the computer device. Therefore, the computer device 100 provides a fast and convenient way to perform overclocking.

Figure 3:
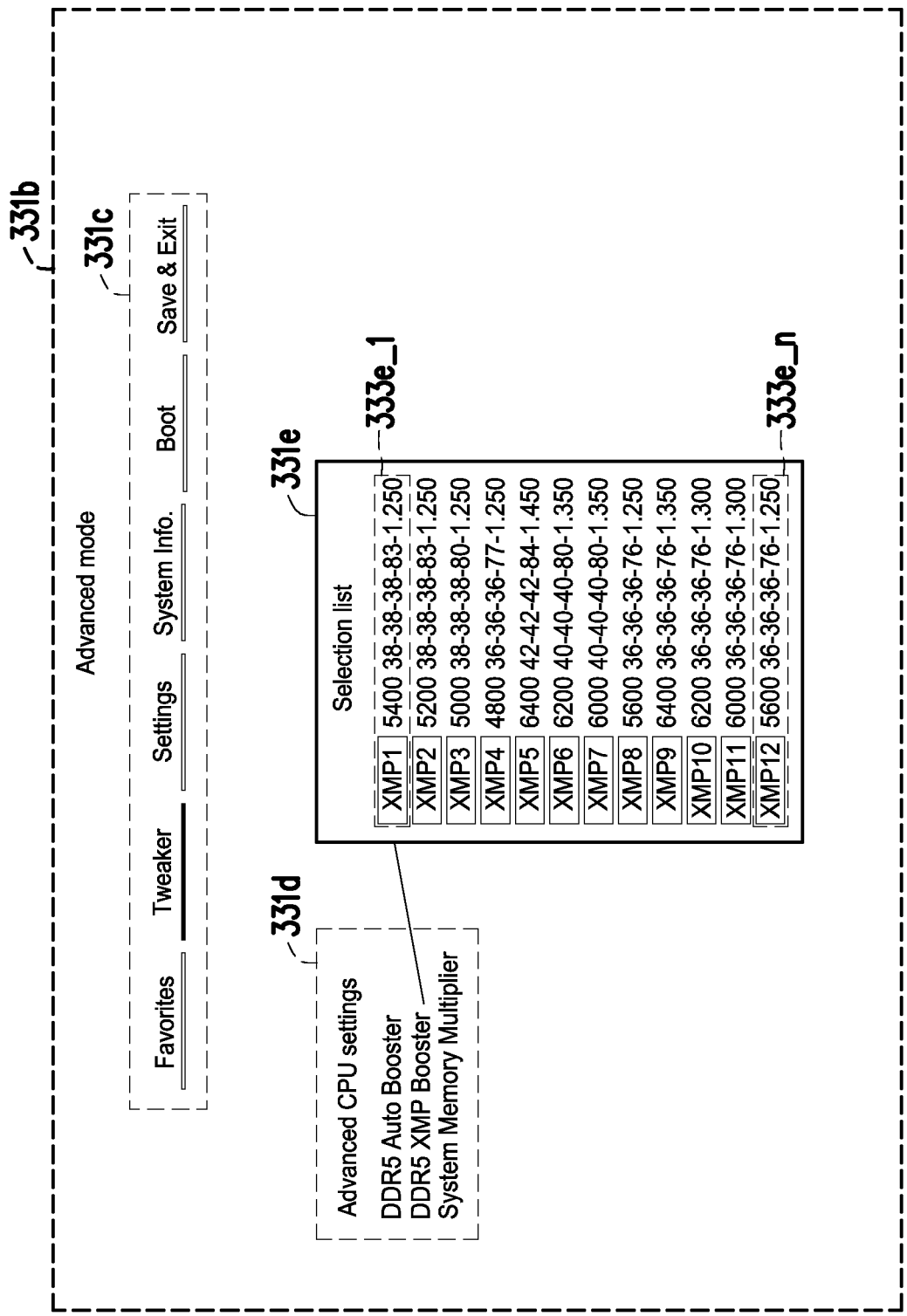
FIG. 3 is a schematic diagram of a UI according to an embodiment of the disclosure.

FIG. 3 is a schematic diagram of a UI according to an embodiment of the disclosure. Please refer to FIGS. 1 and 3. When performing the BIOS 131, the computer device 100 displays the UI 331b through the display so that the user may operate the BIOS 131 through the UI 331b.

In the embodiment, the UI 331*b* displays multiple windows 331*c* to 331*e*. The UI 331*b* displays the setting operation options of the BIOS 131 through the window 331*c*. In the embodiment, the setting operation options of the BIOS 131 are, for example, shortcut settings (indicated by "Favorites"), overclocking operation settings (indicated by "Tweaker"), general operation settings (indicated by "Settings"), browsing of system information (indicated by "System Info."), boot process settings (indicated by "Boot"), and saving and ending BIOS 131 settings (indicated by "Save & Exit"), etc. In the embodiment, the user may click the icon denoted as "Tweaker" in the window 331*c* to enable the BIOS 131 to enter the overclocking operation settings.

In the embodiment, the UI 331*b* displays multiple overclocking setting options in the overclocking operation settings through the window 331*d*. In the embodiment, the overclocking setting option of the BIOS 131 is, for example, using an XMP to perform overclocking, and is indicated by an icon of "DDR5 XMP Booster" so that the BIOS 131 generates a pop-up window 331*e* through the UI 331*b*.

In the embodiment, the UI 331*b* displays the selection list through the window 331*e*. The selection list has multiple overclocking options 333*e*_1 to 333*e*_n. The number of overclocking options 333*e*_1 to 333*e*_n and the sorting method are just examples, and are not limited thereto. In the embodiment, the multiple overclocking options 333*e*_1 to 333*e*_n correspond to multiple XMPs stored in the BIOS 131.

In the embodiment, the first column of the selection list is overclocking options 333*e*_1 to 333*e*_n, and the respective corresponding names are, for example, "XMP1" to "XMP12". Moreover, the overclocking options correspond to the XMPs with the same memory particle type and different frequencies or different memory particle types and the same frequency. The other fields except the first column in the selection list are the data items included in the XMP. Each of the overclocking options 333*e*_1 to 333*e*_n in the selection list corresponding to the XMP displays some of important information about the overclocking option in the data item for the user's reference. The number and information of the data items displayed in the selection list are only examples, and the disclosure is not limited thereto.

In the embodiment, the data items displayed in the selection list in the window 331*e* are memory setting parameters. In the embodiment, the respective memory setting parameters represented by the second column to the rightmost column of the selection list include the memory operating frequency of the memory module 110, a column address strobe or signal (CAS) latency, an SDRAM row address strobe or signal (RAS) to CAS delay time and/or an SDRAM row precharge delay time, an SDRAM row precharge delay time, an SDRAM active to precharge delay time, and a memory operating voltage. It should be noted that the selection list shows some of the aforementioned memory setting parameters, but does not show all the memory setting parameters related to overclocking operations. In some embodiments, the selection list may further display other fields to indicate other memory setting parameters, such as an SDRAM nominal voltage of the core power supply, an SDRAM nominal voltage of the input and output buffer power supply, a peak SDRAM nominal voltage of maximum word line, a memory controller voltage, an SDRAM active to active/refresh delay time, an SDRAM write recovery time, multiple SDRAM refresh recovery delay time, the same bank refresh command (REFsb) delay time, the row-to-row delay—long, the column to column delay—long, multiple column to column delay_long write to write delay time_write recovery, an SDRAM read to precharge command delay time on the same memory rank, a column to column delay—long write to read delay time on the same memory rank, and a column to column delay—short write to read delay time on the same memory rank, etc.

It should be noted that the UI 331*b* displays some of the memory setting parameters through the selection list in the window 331*e*. The user can select an overclocking option in the selection list according to one or more required memory setting parameters (for example, the CAS latency related to the access speed) without considering other memory setting parameters to enable the computer device 100 to operate with the required memory setting parameters. In other words, when the user selects an overclocking option with a specific memory setting parameter, the remaining multiple memory setting parameters corresponding to this overclocking option are read from the corresponding XMP at the same time. Therefore, the user does not need to perform overclocking tests for other memory setting parameters.

In the embodiment, the BIOS 131 calculates the corresponding performance score according to part or all of the memory setting parameters of the respective XMPs (for example, the first memory setting parameters of the first XMP 131*a*_1). The performance score is positively related to the performance generated by the processor 120 operating the memory module 110 according to the corresponding various memory profiles. In some embodiments, the overclocking options 333*e*_1 to 333*e*_n in the selection list further display the corresponding performance scores.

Figure 4:
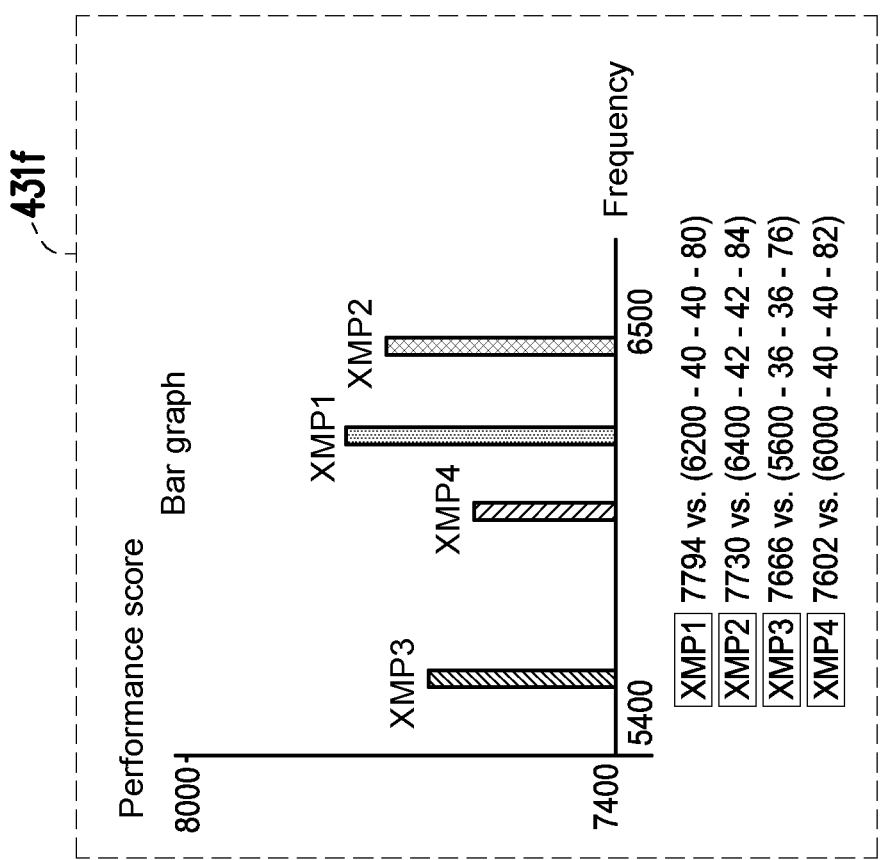
FIG. 4 is a schematic diagram of a UI according to another embodiment of the disclosure.

FIG. 4 is a schematic diagram of a UI according to another embodiment of the disclosure. Please refer to FIGS. 3 and 4. The UI 331*b* further displays the performance score and the corresponding operating frequency through a graph 431*f*. It should be noted that the user may check some of the overclocking options 333*e*_1 to 333*e*_n in the selection list through the window 331*e* to display the corresponding performance score and the corresponding operating frequency. For example, the graph 431*f* is represented by a bar graph. The horizontal axis of the graph 431*f* is the operating frequency in the memory setting parameters. The vertical axis of the graph 431*f* is the performance score. As shown in FIG. 4, since the overclocking options 333*e*_1 to 333*e*_4 are checked in the selection list, the UI 331*b* displays the performance scores of the multiple XMPs (i.e., "XMP1" to "XMP4") corresponding to the overclocking options 333*e*_1 to 333*e*_4 and the corresponding operating frequencies through multiple bars in the bar graph. It should be noted that in the chart 431*f*, the bars may be displayed in different colors, and the colors displayed by the bars are determined according to the corresponding performance scores. For example, the higher the performance score, the higher the grayscale value of the corresponding color is.

Figure 5:
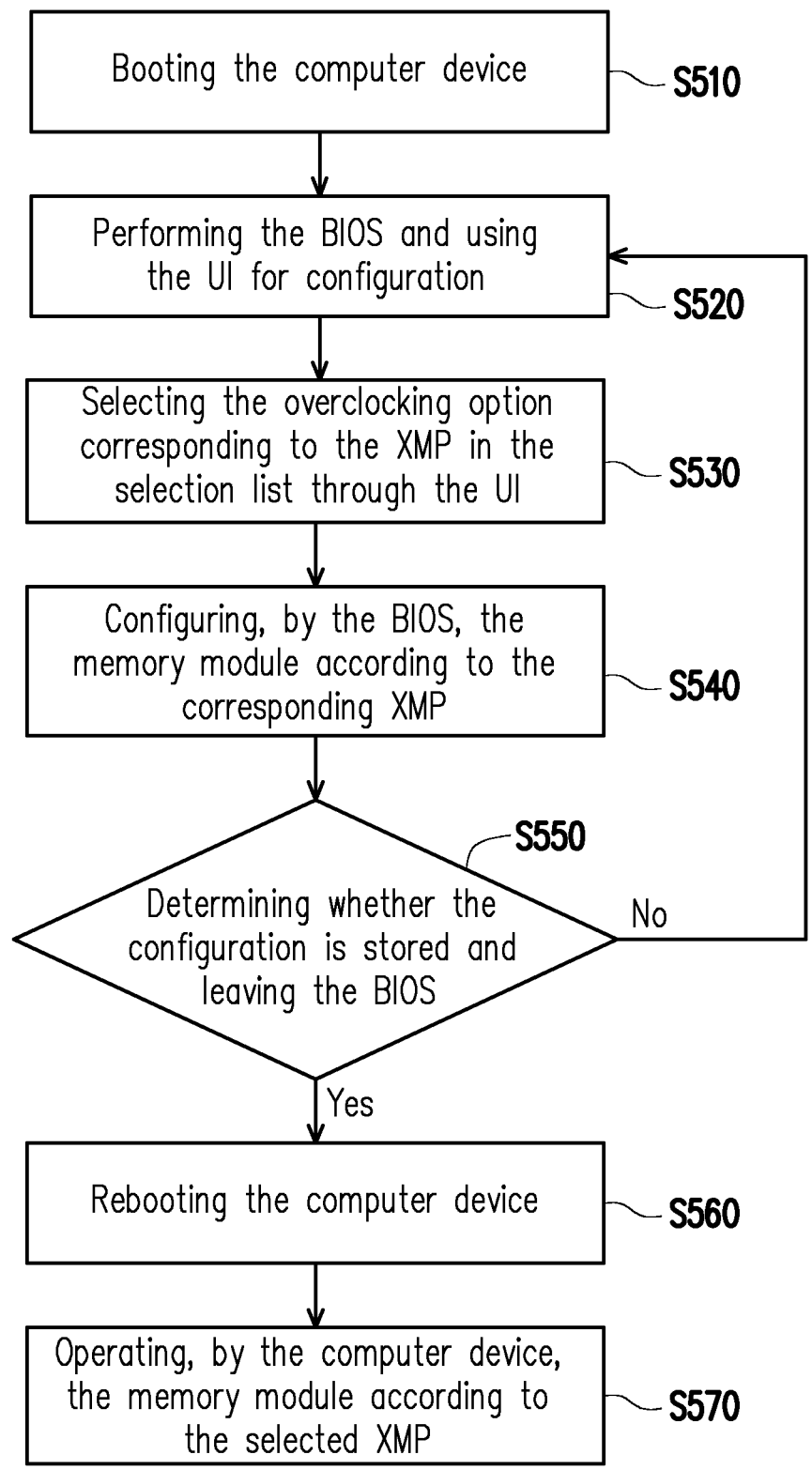
FIG. 5 is a flowchart of a setting method for a memory module according to another embodiment of the disclosure.

FIG. 5 is a flowchart of a setting method for a memory module according to another embodiment of the disclosure. Please refer to FIGS. 1 and 5. The computer device 100 may perform the following steps S510 to S570 to configure the memory module 110. Moreover, the computer device 100 operates the memory module 110 according to the configured memory profile. In step S510, the user turns on the computer device 100 to boot the computer device 100. In step S520, the BIOS 131 is performed by the processor 120, and configures the memory module 110 through the UI for overclocking. In the embodiment, a shortcut key of the computer device 100 is operated to display the UI corresponding to the BIOS 131.

In the embodiment, the UI displays a selection list with multiple overclocking options through a window. The selection list shows some or all of the memory setting parameters of the XMP corresponding to each of the overclocking options. In step S530, the overclocking option corresponding to the XMP in the selection list is selected through the UI.

In the embodiment, when the user selects one of the overclocking options in the selection list, the BIOS 131 generates a selection request. In the embodiment, the BIOS 131 receives the selection request. Based on the selection request, the BIOS 131 reads the corresponding XMP according to the selected overclocking option. In step S540, the BIOS 131 configures the memory module 110 according to the corresponding XMP. In the embodiment, the BIOS 131 reads out multiple memory setting parameters in the XMP, so as to perform overclocking on the memory module 110 according to the memory setting parameters. The modified memory profile is configured as the latest default memory profile in the memory module 110 so that the computer device 100 operates according to the memory profile the next time when being booted.

In step S550, the BIOS 131 determines whether the settings related to the operation of the BIOS 131 have been stored and whether leaving the BIOS 131 is required. In the embodiment, the BIOS 131 determines whether the settings related to the operation of the BIOS 131 have been stored and whether the user requires to finish performing the BIOS 131 according to the response to the icon of "Save and Exit" in the window 331c.

If the response is no, it means that the current settings for the operation of the BIOS 131 have not been completed. The computer device 100 starts performing from step S520 again. In other words, the processor 120 continues to perform the BIOS 131, and the UI continues to operate the BIOS 131.

If the response is yes, it means that the current settings for the operation of the BIOS 131 have been completed, and the processor 120 finishes performing the BIOS 131. Therefore, after the BIOS 131 finishes configuring the memory module 110 according to the memory setting parameters in step S540, in step S560, the user restarts the computer device 100 or the computer device 100 restarts itself to reboot the computer device 100. In step S570, the computer device 100 operates the memory module 110 according to the selected XMP 131a_1 or XMP 131a_2 (i.e., the memory setting parameters of the latest default memory profile stored in step S540) so that the computer device 100 operates at a performance higher than the basic performance.

In summary, the computer device, the setting method for the memory module, and the mainboard of the embodiments of the disclosure can select overclocking options corresponding to the XMP through the UI so that the BIOS perform overclocking on the memory module according to the XMP corresponding to the selected overclocking option. In some embodiments, the BIOS can browse the performance score of the XMP and the corresponding operating frequency through the UI. Therefore, the user can achieve overclocking of the memory module through the UI in a fast and convenient way.

What is claimed is:
1. A computer device, comprising:
a memory module having a serial presence detect (SPD) module;
a processor coupled to the memory module; and
a basic input output system (BIOS) coupled to the processor and storing a first extreme memory profile (XMP), wherein
when the processor performs the BIOS so that the computer device displays a user interface (UI), the BIOS displays a first overclocking option corresponding to the first XMP in a selection list of the UI, wherein
when the BIOS receives a selection request corresponding to the first overclocking option of the selection list, the BIOS reads a plurality of first memory setting parameters corresponding to the first XMP, and configures the memory module according to the plurality of first memory setting parameters,
wherein the first overclocking option displayed in the selection list comprises displaying a part of the plurality of first memory setting parameters, and the part of the plurality of first memory setting parameters comprises a memory particle type, a memory operating frequency, a column address strobe or signal (CAS) latency, a synchronous dynamic random access memory (SDRAM) row address strobe or signal (RAS) to CAS delay time, an SDRAM row precharge delay time, an SDRAM active to precharge delay time, and a memory operating voltage.

2. The computer device according to claim 1, wherein the BIOS calculates a performance score according to the part of the first memory setting parameters of the first XMP, and displays the performance score and the corresponding memory operating frequency through a bar of a bar graph.

3. The computer device according to claim 1, wherein after the BIOS finishes configuring the memory module according to the plurality of first memory setting parameters, the BIOS reboots the computer device so that the processor operates the memory module according to the plurality of first memory setting parameters.

4. The computer device according to claim 1, wherein the SPD module of the memory module does not store an XMP.

5. The computer device according to claim 1, wherein the SPD module of the memory module stores a second XMP, wherein
when the computer device displays the UI, the BIOS displays the first overclocking option corresponding to the first XMP and a second overclocking option corresponding to the second XMP in the selection list of the UI.

6. The computer device according to claim 1, wherein the memory module is a double data rate 5 synchronous dynamic random access memory (DDR5 SDRAM) module.

7. A setting method for a memory module, comprising:
performing, by a processor, a basic input output system (BIOS) to display a user interface (UI) through a computer device, wherein the BIOS stores a first extreme memory profile (XMP);
displaying, by the BIOS, a first overclocking option corresponding to the first XMP in a selection list of the UI;
reading, by the BIOS, a plurality of first memory setting parameters corresponding to the first XMP when the BIOS receives a selection request corresponding to the first overclocking option of the selection list; and
configuring, by the BIOS, the memory module according to the plurality of first memory setting parameters,
wherein the first overclocking option displayed in the selection list comprises displaying a part of the plurality of first memory setting parameters, and the part of the plurality of first memory setting parameters comprises a memory particle type, a memory operating frequency, a column address strobe or signal (CAS) latency, a synchronous dynamic random access memory (SDRAM) row address strobe or signal (RAS)

to CAS delay time, an SDRAM row precharge delay time, an SDRAM active to precharge delay time, and a memory operating voltage.

8. The setting method for the memory module according to claim 7, further comprising:
calculating, by the BIOS, a performance score according to the part of the plurality of first memory setting parameters of the first XMP; and
displaying, by the BIOS, the performance score and the corresponding memory operating frequency through a bar of a bar graph.

9. The setting method for the memory module according to claim 7, further comprising:
rebooting, by the BIOS, the computer device after the BIOS finishes configuring the memory module according to the plurality of first memory setting parameters so that the processor operates the memory module according to the plurality of first memory setting parameters.

10. The setting method for the memory module according to claim 7, wherein a serial presence detect (SPD) module of the memory module does not store an XMP.

11. The setting method for the memory module according to claim 7, wherein a serial presence detect (SPD) module of the memory module stores a second XMP, and the setting method further comprising:
displaying, by the BIOS, the first overclocking option corresponding to the first XMP and a second overclocking option corresponding to the second XMP in the selection list of the UI when the computer device displays the UI.

12. The setting method for the memory module according to claim 7, wherein the memory module is a double data rate 5 synchronous dynamic random access memory (DDR5 SDRAM) module.

13. A mainboard disposed in a computer device, comprising:
a basic input output system (BIOS) storing a first extreme memory profile (XMP) and coupled to a memory module and a processor disposed on the mainboard, wherein
when the processor performs the BIOS so that the computer device displays a user interface (UI), the BIOS displays a first overclocking option corresponding to the first XMP in a selection list of the UI, wherein
when the BIOS receives a selection request corresponding to the first overclocking option of the selection list, the BIOS reads a plurality of first memory setting parameters corresponding to the first XMP, and configures the memory module according to the plurality of first memory setting parameters,
wherein the first overclocking option displayed in the selection list comprises displaying a part of the plurality of first memory setting parameters, and the part of the plurality of first memory setting parameters comprises a memory particle type, a memory operating frequency, a column address strobe or signal (CAS) latency, a synchronous dynamic random access memory (SDRAM) row address strobe or signal (RAS) to CAS delay time, an SDRAM row precharge delay time, an SDRAM active to precharge delay time, and a memory operating voltage.

14. The mainboard according to claim 13, wherein the BIOS calculates a performance score according to the part of the first memory setting parameters of the first XMP, and displays the performance score and the corresponding memory operating frequency through a bar of a bar graph.

15. The mainboard according to claim 13, wherein after the BIOS finishes configuring the memory module according to the plurality of first memory setting parameters, the BIOS reboots the computer device so that the processor operates the memory module according to the plurality of first memory setting parameters.

16. The mainboard according to claim 13, wherein a serial presence detect (SPD) module of the memory module does not store an XMP.

17. The mainboard according to claim 13, wherein a serial presence detect (SPD) module of the memory module stores a second XMP, wherein
when the computer device displays the UI, the BIOS displays the first overclocking option corresponding to the first XMP and a second overclocking option corresponding to the second XMP in the selection list of the UI.

* * * * *